US009443044B2

(12) United States Patent
Gou et al.

(10) Patent No.: US 9,443,044 B2
(45) Date of Patent: Sep. 13, 2016

(54) DETERMINING A QUALITY PARAMETER FOR A VERIFICATION ENVIRONMENT

(71) Applicant: INTERNATIONAL BUSINESS MACHINES CORPORATION, Armonk, NY (US)

(72) Inventors: Peng Fei Gou, Shanghai (CN); Bodo Hoppe, Boeblingen (DE); Dan Liu, Beijing (CN); Yong Feng Pan, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 14/518,364

(22) Filed: Oct. 20, 2014

(65) Prior Publication Data
US 2015/0121323 A1 Apr. 30, 2015

(30) Foreign Application Priority Data
Oct. 24, 2013 (GB) .................................. 1318775.2

(51) Int. Cl.
*G06F 17/50* (2006.01)
*G06F 11/263* (2006.01)
*G06F 11/26* (2006.01)

(52) U.S. Cl.
CPC ......... *G06F 17/5022* (2013.01); *G06F 17/505* (2013.01); *G06F 11/261* (2013.01); *G06F 11/263* (2013.01)

(58) Field of Classification Search
CPC ............. G06F 17/505; G06F 17/5022; G06F 11/261; G06F 11/263
See application file for complete search history.

(56) References Cited

U.S. PATENT DOCUMENTS

| | | | |
|---|---|---|---|
| 5,724,504 A | 3/1998 | Aharon et al. | |
| 6,298,317 B1 * | 10/2001 | Wiemann | G06F 11/3688 703/14 |
| 6,336,206 B1 * | 1/2002 | Lockyear | G06F 17/504 703/15 |
| 6,424,959 B1 * | 7/2002 | Bennett, III | G06F 17/505 706/13 |
| 6,477,688 B1 * | 11/2002 | Wallace | G06F 17/505 716/107 |
| 6,785,870 B2 * | 8/2004 | Chen | G06F 17/505 716/113 |
| 6,789,233 B2 * | 9/2004 | Gore | G06F 17/5068 716/129 |

(Continued)

OTHER PUBLICATIONS

Ghosh et al.; "Synthesis of wiring signature-invariant equivalence class circuit mutants and applications to benchmarking"; Year: 1998; Design, Automation and Test in Europe, 1998., Proceedings; pp. 656-663.*

(Continued)

*Primary Examiner* — Helen Rossoshek
(74) *Attorney, Agent, or Firm* — Steven Chiu, Esq.; Matthew M. Hulihan; Heslin Rothenberg Farley & Mesiti, PC

(57) ABSTRACT

Determining a quality parameter for a verification environment for a register-transfer level hardware design language description of a hardware design. A netlist is generated from the hardware design language description. A list of hardware design outputs is generated, and logical paths in the netlist are generated based on the list of hardware design outputs. Furthermore, a modified netlist involving logical paths is generated by determining whether a gate is selected as an insertion point, and selecting a fault type, which is part of the efficiency vector for the selected gate in the netlist and inserting a mutant. Additionally, a fault simulation is performed and the quality parameter for the verification environment is determined from the fault simulation and the simulation result data.

20 Claims, 7 Drawing Sheets

(56) References Cited

U.S. PATENT DOCUMENTS

| | | | | |
|---|---|---|---|---|
| 7,024,345 | B1* | 4/2006 | Stamm | G06F 17/5022 703/14 |
| 7,072,814 | B1* | 7/2006 | Stoica | G06F 17/5063 703/13 |
| 7,404,110 | B1* | 7/2008 | Johnson | G06F 11/263 714/700 |
| 7,472,051 | B2* | 12/2008 | Mariani | G06F 11/27 703/13 |
| 7,526,741 | B2* | 4/2009 | Lee | B01F 15/00935 703/16 |
| 7,555,739 | B1* | 6/2009 | Ginetti | G06F 17/5045 716/107 |
| 7,694,253 | B2* | 4/2010 | Campos | G06F 17/5009 716/106 |
| 7,840,927 | B1* | 11/2010 | Dozier | G06F 17/505 716/123 |
| 8,010,919 | B2* | 8/2011 | Grosse | G06F 11/008 716/106 |
| 8,365,120 | B2* | 1/2013 | Alpert | G06F 17/5077 716/110 |
| 8,443,329 | B2* | 5/2013 | McConaghy | G06F 17/5063 703/22 |
| 8,504,948 | B2* | 8/2013 | Nagrath | H04L 12/6418 716/30 |
| 8,560,991 | B1* | 10/2013 | Fuss | G06F 17/5081 324/528 |
| 8,990,746 | B1* | 3/2015 | Goyal | G06F 17/5022 716/106 |
| 8,997,034 | B2* | 3/2015 | Chang | G06F 17/5081 703/13 |
| 2009/0222774 | A1* | 9/2009 | Grosse | G06F 17/5022 716/106 |
| 2009/0307638 | A1* | 12/2009 | McConaghy | G06F 17/5063 716/104 |
| 2010/0057424 | A1* | 3/2010 | Grosse | G06F 17/5022 703/14 |
| 2011/0302541 | A1 | 12/2011 | Yang et al. | |
| 2014/0019925 | A1* | 1/2014 | Grosse | G06F 17/5081 716/107 |
| 2014/0089872 | A1* | 3/2014 | Galpin | G06F 17/5022 716/102 |
| 2015/0026669 | A1* | 1/2015 | Eddington | G06F 8/51 717/137 |
| 2015/0254383 | A1* | 9/2015 | Tso-Sheng | G06F 17/5045 716/107 |
| 2015/0379187 | A1* | 12/2015 | Gou | G06F 17/5081 716/107 |

OTHER PUBLICATIONS

Amaricai et al.; "Probabilistic Gate Level Fault Modeling for Near and Sub-Threshold CMOS Circuits"; Year: 2014; Digital System Design (DSD), 2014 17th Euromicro Conference on; pp. 473-479.*

Boncalo et al.; "Error-Model Driven Analysis of Quantum Circuits Reliability"; Year: 2008; Nanotechnology, 2008. NANO '08. 8th IEEE Conference on; pp. 625-628.*

Certess Inc., 2007, "Certitude," [online], http://www.iss.se/files/4/Certess_datasheet.pdf, [accessed Feb. 27, 2014], 4 pages.

Search Report for GB1318775.2 dated Mar. 3, 2014, 3 pages.

* cited by examiner

DETERMINING A QUALITY PARAMETER FOR A VERIFICATION ENVIRONMENT

PRIOR FOREIGN APPLICATION

This application claims priority from United Kingdom patent application number 1318775.2, filed Oct. 24, 2013, which is hereby incorporated herein by reference in its entirety.

BACKGROUND

One or more aspects of the invention relate generally to determining a quality parameter for a verification environment for a register-transfer level hardware design language description of a hardware design. One or more aspects relate further to a verification system, a method, a computing system, a data processing program, and a computer program product.

New electronic systems, in particular digital chips like a System-on-a-Chip (SoC), are typically designed by using software tools. These allow designing, simulating and testing the functionality before the chip is built as a semiconductor. Typically, a hardware description language or hardware design language (HDL) is used. Producing the actual chip is very expensive. Therefore, intensive testing of the design is required. Typically, simulation-based verification is used for this purpose. A basic idea is verification by redundancy. An alternative design with slight modifications may be used and outputs of the original design and the slightly modified design may be compared. This process may be automated. A checking system, i.e. a checker, for the comparison plays a key role in this process. Challenges lay in stimuli generation for the alternative design, as well as in the checker.

Typically, the basic assumption is made that an optimum of the behavior of the design under test will be captured by the checking system. On the other side, it is also known that checkers are error-prone because they may be wrongly coded, disabled, incomplete and so on.

Simulation-based testing of new hardware designs may be based on mutation testing, which is a fault-based testing technique. Artificial faults may be injected into the design. Then, it is observed whether the checkers may detect the faults. This procedure is based on the general assumption that faults are often caused by programmers of the hardware design. A mutant can be seen as a syntactical change to the original HDL design.

A typical way of hardware mutation testing may be performed in the following way: as input, an HDL design and a test suite for a regression, i.e., a simulation run may be used. For a mutant generation, the HDL design is analyzed and it is determined what kind of mutants are to be inserted into the HDL design. For this, insertion points are determined and typical fault types are used to select or define a mutant to be inserted into the HDL design, which becomes an instrumented design. Then, a fault simulation may be performed by conducting a regression test using the instrumented design. As immediate results, test cases are used, wherein the mutants in signal paths of the HDL design generate a modified behavior of the outputs, which is detected as an error by the checker. On the other side, the mutant may lead to an error propagation that may not be detected by the checking program, i.e., the checker.

A related procedure has been disclosed by the document U.S. Pat. No. 8,010,919 B2, incorporated by reference herein in its entirety. In this document, a method for rating the quality of a computer program whose execution involves an integrated circuit's input and output data being influenced is described. Several steps are performed by the described method. Firstly, a mutated integrated circuit is provided. Then, the mutated integrated circuit's input and output data from the mutated integrated circuit are recorded. A comparison of the mutated integrated circuit and the original integrated circuit is performed. Then, the quality of the computer program on the basis of the results is determined.

However, there are a couple of challenges for mutation testing. One may be the related high simulation costs. This can be demonstrated by a cost estimation of a middle sized unit: assuming 10 fault types, 100 test cases, 1000 insertion points, and a computer system which may be able to run 10,000 cases per day. This may result in a mutation test using $10^4$ mutants, running $10^6$ tests and needing about 100 days. This is totally impractical. Therefore, as mutation based testing often starts at a late stage of verification when a test bed is relatively stable, the number of mutants have to be limited and at the same time, the verification environment needs to produce meaningful results. Therefore, in light of the number of circuits and its complexity, inserting mutants manually into the hardware design is an impractical approach. Additionally, a new compilation may be required for every mutant inserted. And the mutant may be active constantly which may limit the flexibility of the test cases.

Overall, problems may lay in a low efficient insertion point selection (e.g., multiple points may affect the same output path), a re-usage of historical data, and the high volume of data as a result of the verification tests which may not be able to be assessed manually.

BRIEF SUMMARY

According to one embodiment, a method for determining, i.e., evaluating or rating, a quality parameter for a verification environment may be provided. The verification environment may be adapted for a register-transfer level hardware design language description of a hardware design. The method may comprise generating a netlist from the hardware design language description, and generating a list of hardware design outputs. Additionally, the method may comprise generating logical paths in the netlist based on the list of hardware design outputs, and generating a modified netlist involving logical paths by determining for each gate in each of the logical paths whether the gate is selected as an insertion point, and selecting a fault type for the selected gate in the netlist, and inserting a mutant and associated activation and monitoring logic in the netlist. The fault type, the mutant and the associated monitoring logic may be each selected from a mutant database. This way the modified netlist may be generated.

Furthermore, the method may comprise performing a fault simulation based on the modified netlist and collecting simulation result data using the monitoring logic, and determining the quality parameter for the verification environment from the fault simulation and the simulation result data.

According to another embodiment, a verification system for a register-transfer level hardware design language description of a hardware design may be provided.

BRIEF DESCRIPTION OF THE SEVERAL VIEWS OF THE DRAWINGS

Embodiments of the invention will now be described, by way of example only, and with reference to the following drawings.

DETAILED DESCRIPTION

Figure 1:
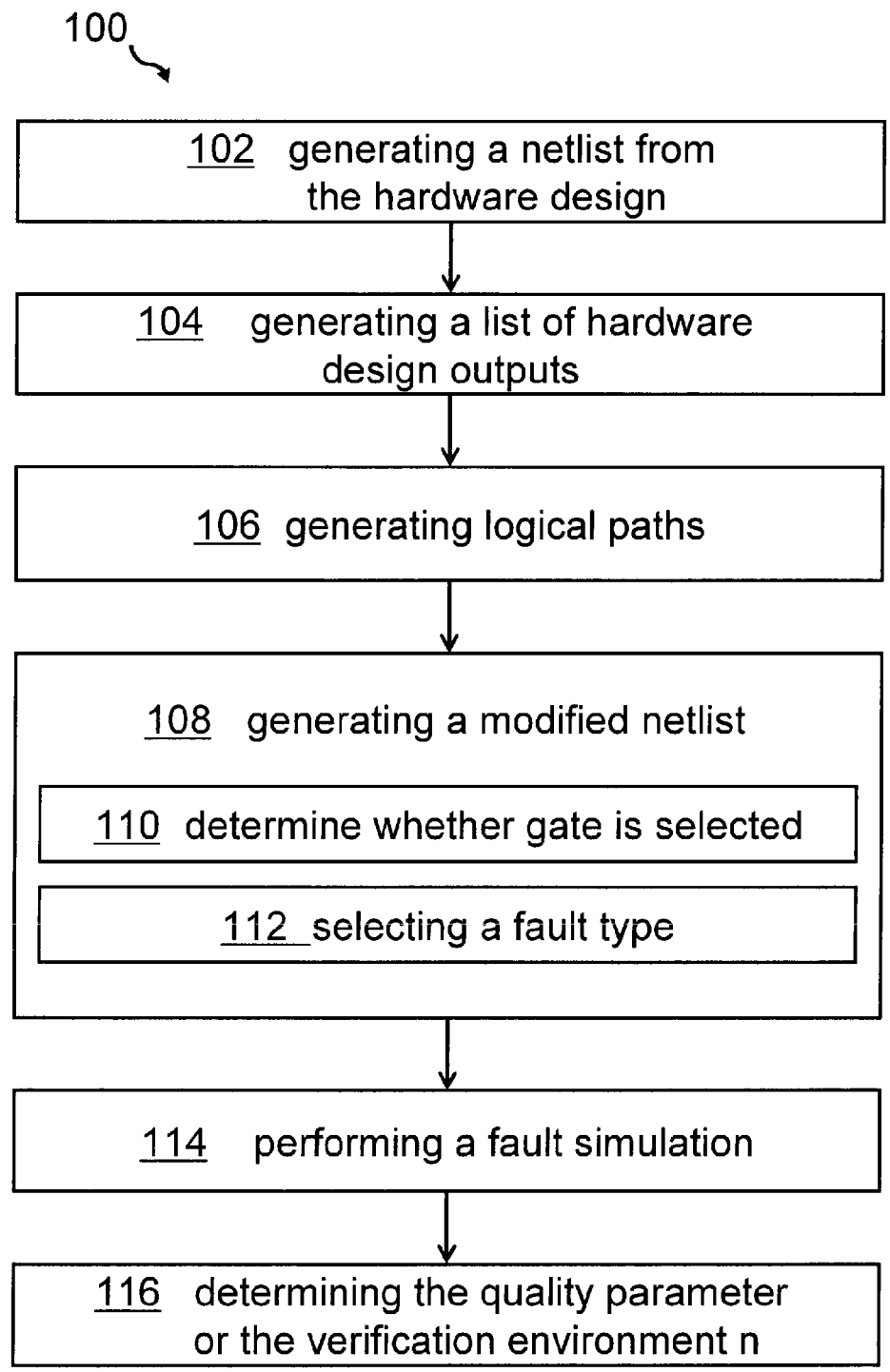
FIG. 1 shows one example of a block diagram of a method for determining a quality parameter for a verification environment for a register-transfer level hardware design language description of a hardware design.

In the context of this description, the following conventions, terms and/or expressions may be used:

The term "quality parameter" may denote a mathematical value allowing assessing and comparing a quality of a verification environment hardware design described by using a hardware design language. The quality parameter may be based on two components, namely the driver quality, i.e., the "stimuli" and/or the driver scenario completeness, and the checker quality.

A "verification environment" may denote a system adapted to verify an HDL design, in particular, e.g., a register-transfer hardware design language. The hardware design may be described by functional points based on defined input and output signals to a circuitry, in particular a digital circuitry.

The term "netlist" may denote a list of electronic components including related connections between the electronic components, in particular electronic gates.

"Hardware design outputs" may denote signals available at components or subcomponents of a hardware design. In the context of an HDL design, hardware design outputs may denote modeled signals when executing or interpreting the HDL. Hardware design outputs may not only be available on a top level of the HDL design but also on a lower level for subcomponents of the overall HDL design.

A "logical path" may denote a way between simulated input signals, electronic gates in-between, and resulting output signals, i.e., a hardware design output.

A "mutant" may denote a modification of an electronic circuitry defined in HDL. The mutant may use the same input and output signals as the original gates but may electronically behave differently. Mutants may be inserted into the original design at insertion points. The mutants or—in a long version—modified register-transfer level hardware design language description of a part of the hardware design may be stored in a specific database, called a mutant database. Here, all known and potential candidates for modifications may be stored and classified.

A "modified netlist" may denote a netlist—see above—including the mutants. In the context of this description, the modified netlist may not only comprise the modifications made to the original netlist comprising the mutants, but also the original netlist in a complete form. Thus, the original netlist as well as the mutant containing netlist may be comprised in the modified netlist.

In the context of this description a "gate" may denote any digital electronic circuitry, like, e.g., an AND-gate, an OR-gate, a NOR-gate, a NAND-gate, an inverter, or the like.

An "insertion point" may be a point within an electronic circuitry at which a mutant may be inserted. The mutant electronic circuitry may use the same input signals as the original electronic circuitry. Output signals of the original electronic circuitry and the mutant may alternatively be used and may be switchable, using, e.g., a multiplexer.

In the context of this description, reference may be made to different hardware "fault types". Examples of hardware fault types may comprise combinations of logic errors, sequential logic errors, statement errors, and/or expression errors. These errors describe typical errors made when designing an electronic circuit using HDL. A more detailed error description and examples will be given later on.

The term "efficiency vector" may denote any new criterion to estimate a mutant's priority. It may, e.g., be a 7-bit vector constructed during mutant generation. For every mutant—see above—a specific efficiency vector may be designed. Components of the efficiency vector may at least comprise an identifier, an insertion point, a fault type and a mutant.

The reference "activation and monitoring logic" may denote one or more electronic circuits to activate a mutant. Using these electronic circuits, a mutant may be activated and the behavior of the mutant may be monitored using the monitoring logic, dynamically at runtime of a simulation run.

The term "fault simulation" may denote a selection of mutants according to the value of the efficiency vector in order to run a simulation using the mutants instead of the original electronic circuitry described in HDL in the unmodified netlist.

The expression "simulation result data" may refer to results of a fault simulation run. Comparisons may be made between the original output signals of an electronic design compared to those output signals of the electronic design comprising the mutants.

In one or more aspects, the proposed technique allows for a quality improvement of a verification environment for HDL designs. A higher number of tests may be made within the same time period because a higher number of mutants may be used within the same time frame. A quality improvement may also be achieved with less numbers of insert points, and also in shorter time by mutant selection based on historical data using, e.g., the mutant database. By combining the original netlist and the modified netlist comprising also the mutants and an active detection, whether a mutant is active or not, a more precise determination about the effectiveness of the mutant(s) may be made. The results may also be stored in a statistical database for further improving the verification environment. The proposed method goes beyond the known verification environments by providing, e.g., efficiency vectors, mutant activation and monitoring logic as well as selective and dynamic, i.e., at runtime of the verification environment, activation of the mutants. Verification runs may focus on different fault types. Programming errors of an HDL design often made by a programmer may be detected easier. Finally, the quality of the verification environment—or, in other words, the test bench—may be evaluated. Overall, the method, as well as the verification system concentrates on the verification of the quality of the checkers of the verification environment. In addition, also the quality of the drivers, i.e., the stimuli for the verification environment may be evaluated for completeness and quality.

According to one embodiment, the associated activation and monitoring logic may comprise at least an XOR gate, in particular at least two XOR-gates. They may be useful for monitoring an active mutant. They may have the mutant's and the original gate version—later-on denoted as shadow U1—output signals as input. Another XOR-gate may monitor output signals from within the modified netlist: from the mutant and the unmodified logical path. Only if the mutant generates differences on both XOR gates, wherein the first one monitors the different output behavior on the module boundary and the second one monitors the different output behavior on the mutant itself, the mutant is a valid and useful mutant. If, for example, the original gate is an AND gate having two inputs and the mutant is an AND-gate having three inputs, wherein the third input is always true, no difference in output signals may be detected. Such a mutant may be classified as useless. Furthermore, if, for example, the mutant is active, but the output difference does not propagate to the module output due to other factors on the path, the mutant may also be classified as useless. Thus, an effectiveness of a mutant may be determined based on an output of the XOR gate having a mutant output signal and an output signal of an element of the netlist, in particular the original logic output signal as input. The effectiveness of a mutant may be defined in the sense of "has it generated a difference on both, the mutant itself and the module output?".

According to one embodiment, the associated activation and monitoring logic may also comprise one or more multiplexer(s) using output signals of gates of the netlist, in particular of the original HDL design, and output signals of the mutants as input signals. The output signals of the multiplexer may be activated by an enable signal. Either an output signal of the original netlist—i.e., output signal of gates of the original netlist—may be activated for a cell or sub-box of the overall design or an output signal of a mutant may be activated. This way, the original and the related mutant code may be activated selectively for a sub-box of the overall design. Thus, each mutant is dynamically activatable at runtime of the verification environment by activating a select or enable signal of the multiplexer. This allows for improved flexibility during testing of hardware designs.

According to one embodiment, the modified netlist may comprise original logic paths, i.e., original logic gates. This feature makes it possible to selectively activate original design code or mutants during test scenarios allowing for a great deal of flexibility. Known verification environments focus on having the mutants included. This way, a dynamic comparison and activation and de-activation of mutant code during runtime seems not to be possible or, in other words, the performing of the fault simulation may comprise a dynamical, at runtime of the verification environment, activation of the inserted mutant. In parallel, a monitoring of the simulation result data, e.g., as output signals of the above-mentioned XOR-gates may be performed.

According to one embodiment, input signals are fed in parallel to the elements, in particular of the netlist—e.g., the original HDL design—and to elements of the modified netlist—i.e., the mutants. This way, the original gates—or sub-boxes comprising several gates—may work in parallel to the mutants. Via the multiplexer on the output side, it may dynamically be decided which of the two output signals—from the original HDL design or the mutants—may be used.

According to one embodiment of the method, the determining for each gate in each of the logical paths if the gate is selected as an insertion point may comprise generating an efficiency vector for components of the logical path. Such an efficiency vector may be useful for an insertion point identification, a fault type identification and a mutant identification. This may be achieved by using a seven-bit efficiency vector as described below. However, other efficiency vector lengths are possible comprising more or less information.

Furthermore, embodiments may take the form of a computer program product, accessible from a computer-usable or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

It should also be noted that embodiments of the invention have been described with reference to different subject-matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between, e.g., features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, but to which the invention is not limited.

In the following, a detailed description of the figures will be given. All instructions in the figures are schematic. Firstly, a block diagram of an embodiment of the method for determining a quality parameter for a verification environment and more detailed aspects, in accordance with one or more embodiments, is given. Afterwards, an embodiment of the verification system will be described.

FIG. 1 shows a block diagram of an embodiment of a method 100, in accordance with one or more aspects, for determining a quality parameter for a verification environment, in particular for a checker and driver (=stimuli) quality, for a register-transfer level hardware design language description of a hardware design. The method 100 may comprise generating, 102, a netlist from the hardware design language description. This may be performed by parsing the HDL code, interpreting it and generating the netlist as output.

Further, the method may comprise generating, 104,—or defining manually, automatically or, in a mixed mode—a list of hardware design outputs, in particular on each level of the hardware design; not only top level but also sub-level or sub-boxes.

Moreover, the method may comprise generating, 106, logical paths, in the netlist based on the list of hardware design outputs, in particular by traversing or tracing back the netlist and identifying the influential elements in the path for an output signal.

Then, a modified netlist may be generated, 108, involving logical paths by determining, 110, for each gate in each of the logical paths whether the gate is selected as an insertion point, in particular for a mutant. This selection may be accompanied by a generation of a path specific efficiency vector. Furthermore, the method may comprise selecting, 112, a fault type—which may become part of the efficiency vector—for the selected gate in the netlist and inserting a mutant. The type of the mutant to be inserted may be based on the fault type. Moreover, associated activation and monitoring logic may be included into the netlist, in particular a multiplexer and one or more XOR-gates. The fault type, the mutant and the associated monitoring logic may be each selected from a mutant database. This way, the modified netlist may be generated. It may be noted that the modified netlist may comprise also the original netlist, as well as the version with the mutants.

Additionally, the method may comprise performing, 114, a fault simulation based on the modified netlist and collecting simulation result data using the monitoring logic, and determining, 116, the quality parameter for the verification environment from the fault simulation and the simulation result data. This may be performed by comparing the number of activated mutants and the detected errors. A target may be a 100% detection rate. The quality parameter may have two influential factors: the drivers for the stimuli of the elements of the netlist and the checker, or detecting a faulty design.

Figure 2:
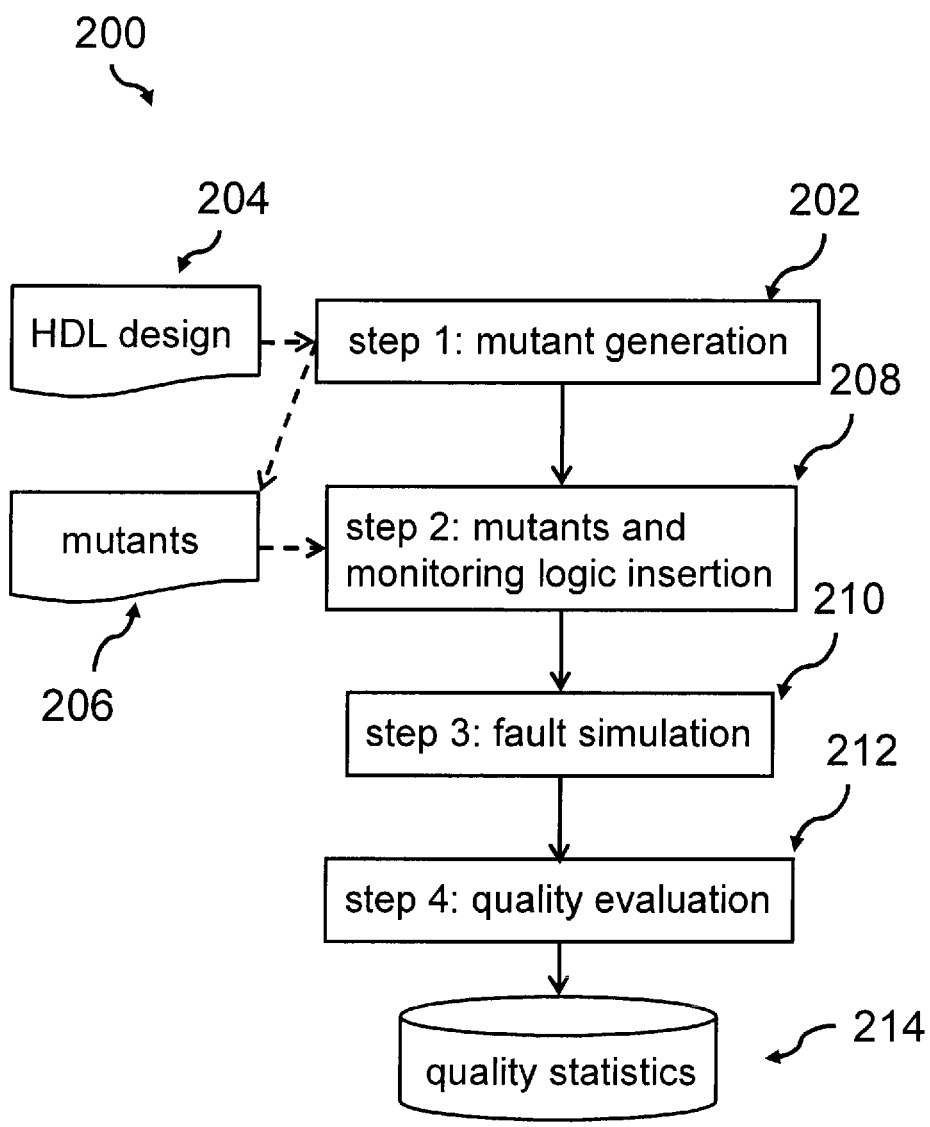
FIG. 2 shows one example of a block diagram of a traditional mutation testing process.

FIG. 2 shows a block diagram 200 of a traditional mutation testing process. The process comprises basically four steps. In step 1, 202, mutants are defined. Input for the step may be based on the underlying HDL design 204. In step 2, 208, mutants, and activation and monitoring logic may be inserted into the HDL design 204 from step 1, 202. The mutants may be selected from a mutant database 206. This process may be influenced by the original HDL design 204, done during step 1, 202. In step 3, 210, a fault simulation may be performed, and in step 4, 212, the quality may be evaluated. Quality statistics may be stored for later analysis in a quality statistics database 214.

Figure 3:
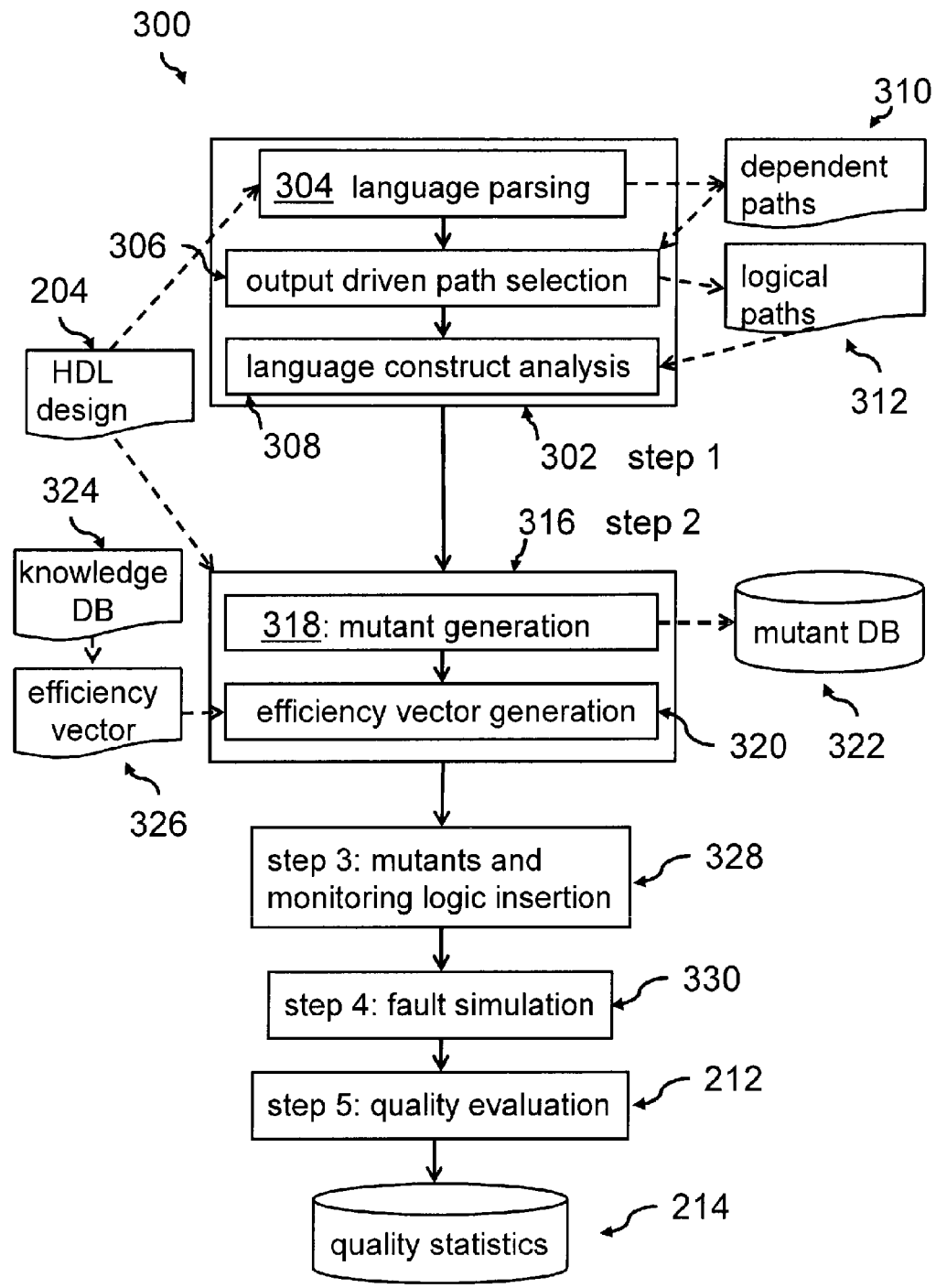
FIG. 3 shows one example of a more detailed block diagram of one embodiment for determining the quality parameter for the verification environment, in accordance with one or more aspects.

FIG. 3 shows a more detailed block diagram 300 of one embodiment of the method for determining the quality parameter for the verification environment. If compared to elements of FIG. 2, most block elements are either new or modified. Starting from an HDL design 204, in step 1, 302, a language parsing 304 is performed, generating dependent paths 310. From here, an output driven path selection 306 using all available dependent paths 310 as input may be performed. A logical path list 312 may be one result. In a next step called "language constructs analysis", 308, the logical path list 312 may be used as input. The steps 304, 306, and 308 may define step 202 if compared to FIG. 2. Thus, step 1, 302, describes a language parsing and path analysis step.

Step 2, 316, may comprise the mutant generation 318 as well as an efficient vector generation 320 for a given path. The generated mutants may be stored in a mutant database 322. The efficiency vector generation 320 may be based on a knowledge database 324 comprising efficiency vectors 326.

It may be noted that the elements 304, 306, 308, 310, 312, 318, 320, 322, 324, 326 are new if compared to the elements described in the context of FIG. 2. In addition, the original HDL design 204, step 3, 328, as well as step 4, 330 have to be modified in order to comply with one or more aspects of the method. In step 3, 328, the mutants and the monitoring logic insertion—which comprise both, an activation logic and a monitoring logic—has to reflect the results of the preceding steps, in particular the way the mutants are based on the efficiency vectors. Also the fault simulation 330 execution, and step 5, 212, namely a quality evaluation, needs to comply with the modified mutants and activation logic. Finally, results are stored in the quality statistics database 214 for further quality analysis.

It may be noted that the knowledge database 324 may comprise information about typical errors made in HDL designs, as well as results of preceding verification runs.

Figure 4:
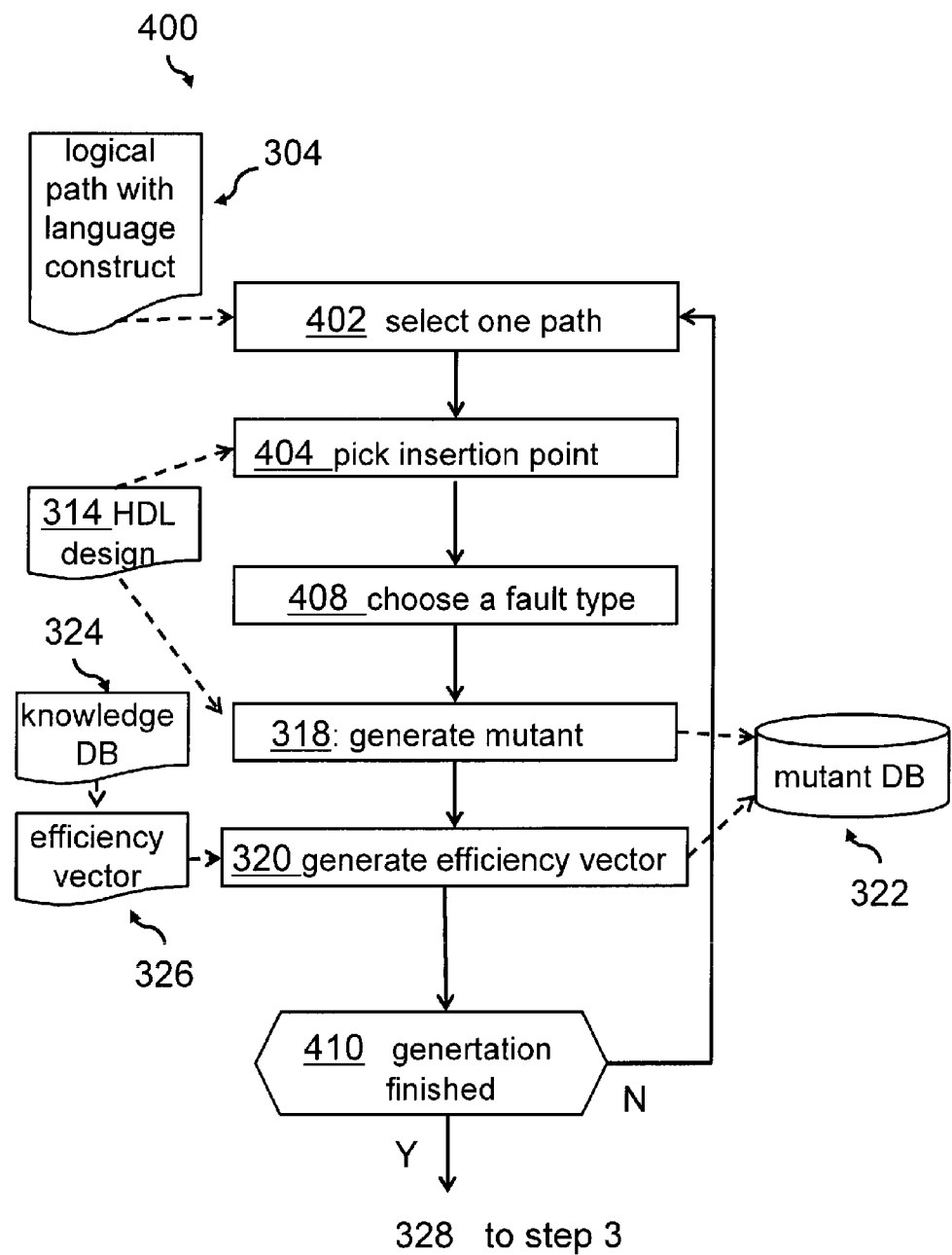
FIG. 4 shows one example of a more detailed block diagram of one step of the block diagram of FIG. 3.

FIG. 4 shows a more detailed block diagram 400 of step 2 of the block diagram 300 of FIG. 3. Step 2, 316, starts with a path selection 402. As input, logical paths with corresponding language constructs may be used. In a selected path, an insertion point for a mutant may be picked, 404. Based on this, a fault type may be chosen, 408. Next steps are the generation of the mutant, 318, and the generation of the efficiency vector, 320, as already described in the context of FIG. 3.

If all relevant paths have been picked it may be decided, 410, that the generation is finished and that the processing should continue with step 3, 328 (compare FIG. 3). If the generation is not finished the execution may return to the selection of the next path, 402.

Figure 5:
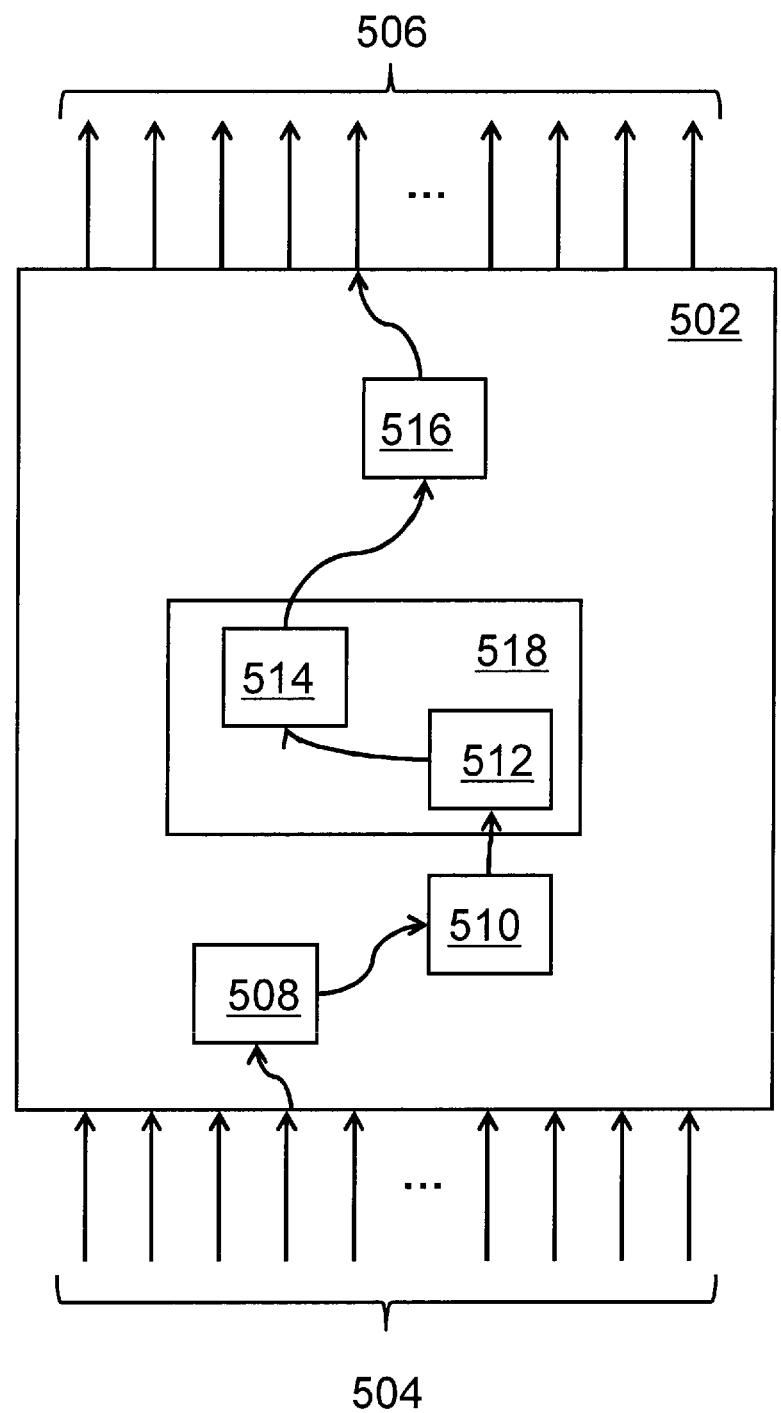
FIG. 5 shows one example of a block diagram for an example of a logical path.

In order to illustrate the concept of a logical path, FIG. 5 may be instrumental. Box 502 may denote a top box of the HDL design 204. Arrows coming from below may denote input signals 504 to the top box 502. Reference numerals 508, 510, 512, 514, 516 may denote examples of electronic gates within the HDL design 204. Several electronic gates, e.g., 512 and 514, may be combined to a combined function 518. Also such a combined function 518, or sub box 518, may have corresponding input and output signals. Output signals of the top box 502 may be referenced by 506. The winding arrows between one of the input signals 504 and the gates 508, 510, 512, 514, 516 and one of the output signals 506 may define a logical path within the HDL design 204. It may be noted that for such a logical path an efficiency vector may be defined. It may also be noted that the winding arrows basically describe the net defined by the netlist.

An overview of hardware fault types may be given in the following:
combinational logic—wrong signal source (connect wrong input)
  unconnected input (floating input)
  unconnected output
  missing input (input used but undefined)
  conflicting output (multiple driver to the same output)
sequential logic—missing latch/flipflop (miss a level of flipflop in the logic)
  extra latch/flipflop
  extra state
  missing state
  wrong next state
statement—if-statement (extra or missing branch)
  case-statement (extra or missing label)
expression—missing term/factor extra term/factor
missing inversion
extra inversion
wrong operator
wrong constant In order to illustrate the construction of an efficiency vector, an example for a system-on-a-chip using a processor, a PCI-express (peripheral component interconnect) and EDRAMMC (embedded dynamic RAM memory controller) together with a first priority fault group and a second priority may be illustrated in the following:

| 1$^{st}$ prio | fault group | fault type | collect from | 2$^{nd}$ prio |
|---|---|---|---|---|
| 1 | most common type | wrong signal source | processor, PCIE | 1 |
|  |  | missing term/factor | PCIE, EDRAMMC | 1 |
|  |  | missing latch/flip-flop | EDRAMMC | 2 |
| 2 | missing logic & expression error | missing inversion | processor, PCIE | 1 |
|  |  | missing input | Processor | 2H. |
|  |  | extra term/vector | PCIE | 2H. |
|  |  | wrong constant | PCIE | 2H. |
|  |  | wrong operator | PCIE | 2H. |
| 3 | simple errors | wrong bus width | processor, PCIE | 1 |
|  |  | unconnected input | Processor | 2 |
|  |  | extra inversion | Processor | 2 |
|  |  | unconnected output | PCIE | 2 |
|  |  | wrong bus order | PCIE | 2 |
| 4 | other errors | all other fault types | Processor, PCIE | 1 |

Based on this example, a 7-bit efficiency factor constructed during mutant generation may have the following structure:

| bit | group | meaning |
|---|---|---|
| 6 | insertion point | designer specify |
| 5 | insertion point | control logic |
| 4 | fault type | fault group 1$^{st}$ priority |
| 3 | fault type | fault group 1$^{st}$ priority |
| 2 | fault type | fault group 2$^{nd}$ priority |
| 1 | mutant | configurable for mutant priority |
| 0 | mutant | configurable for mutant priority |

This may allow for a very detailed simulation control of the mutants using the verification environment, as well as a detailed analysis if referring to the enable or activation logic—i.e., enable signal 618 (FIG. 6) and multiplexer 616—and monitoring logic, i.e., XOR-gates 614 and 624 of FIG. 6 (see below). In this sense, it may be understood that the efficiency vector may also be seen as a control vector controlling the functionality of the verification environment.

Figure 6:
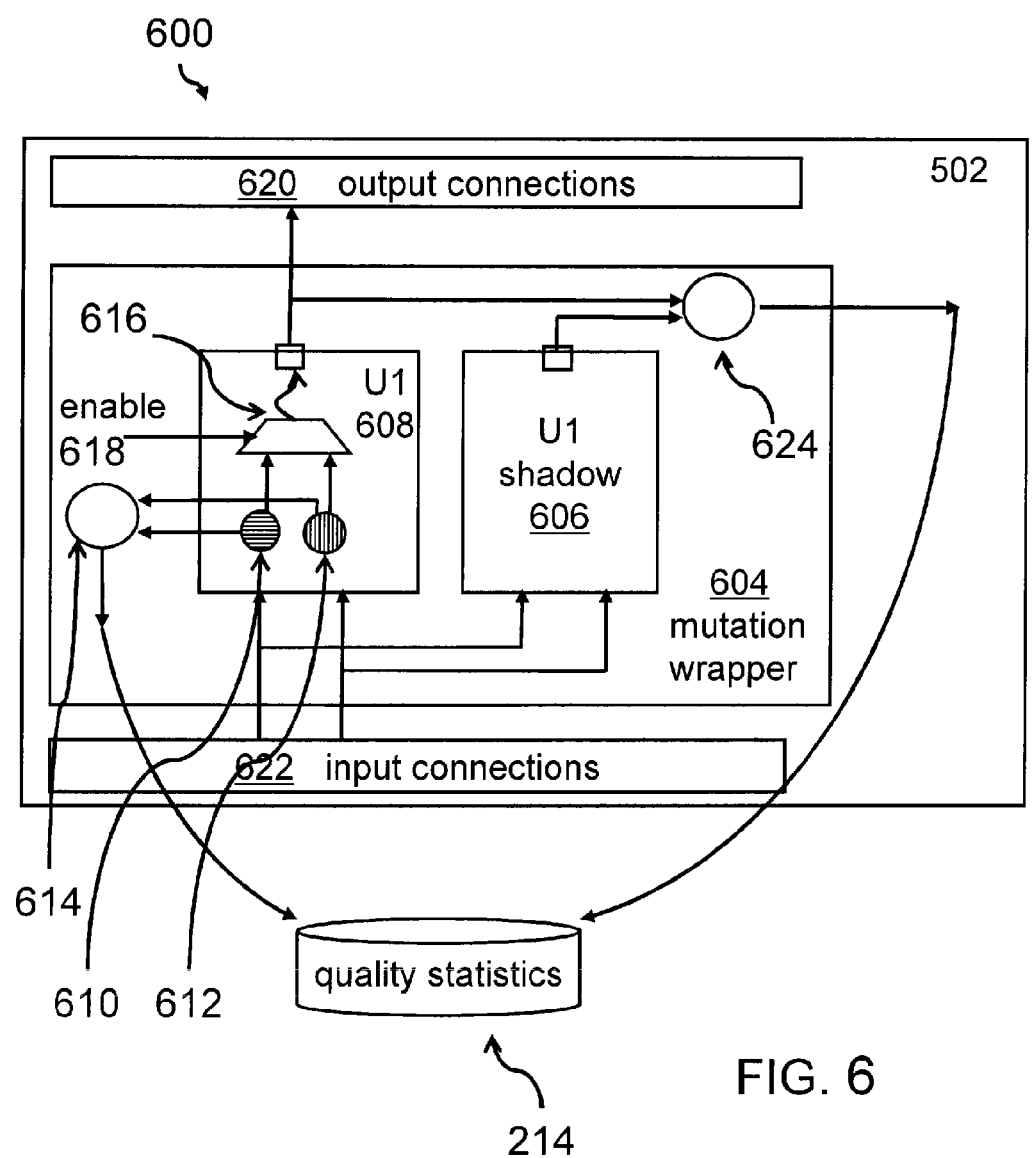
FIG. 6 shows one example of a block diagram comprising an original electronic circuitry together with a mutant and its integration into the HDL design.

FIG. 6 shows a block diagram 600 comprising an original electronic circuitry 606 together with a mutant 608 and its integration into the HDL design 204 of the top box 502. Within the top box 502, a mutation wrapper 604 may be used to encircle the HDL design 204 of the original electronic circuitry 606, here denoted as U1 shadow 606, as well as the original electronic circuitry combined with a mutant, here denoted as U1 608. Circles 610 and 612 may denote an output signal 610 of the related electronic circuitry or gates from the original circuitry 606, as well as an output signal 612 from a mutant. These signals from an active mutant 608 may be fed to an XOR-gate 614. If the output signals 610 and 612 are different, the XOR-gate 614 will deliver an output signal which may be stored in a quality statistics database 214 for further reference and analysis.

On the other side, there may be an XOR-gate 624 having the output signals of block 606 and block 608 as input signals. If a difference between the original electronic circuitry 606 and a mutant comprising circuitry 608 may be generated, the XOR-gate 624 will generate an output signal, which can also be used as input for the quality statistics database 214. It may demonstrate that the mutant 608 was effective. Further signals and information may also be stored in the quality statistics database 214.

For testing purposes, either the original signal 610 or the signal from the mutated electronic circuitry 612 may be used as an output signal for box 608. For this purpose, a multiplexer 616 may enable either of the two output signals 610, 612 using the enable signal 618. For a test run, the output signal of block 608 may be connected with output connections 620. On the input side, connections may be made from corresponding input connections 622 for input signals to the boxes 606 and 608.

It may also be noted that an activation of a mutant—in particular by the multiplexer—may not automatically generate a different output for 502. The mutant 608 may behave equivalently to the original circuit. Furthermore, the mutant behaving differently may not automatically generate a different output on a module boundary. However, if the output of both XOR-gate 614 and XOR-gate 624 may be switched to "1", the mutant 608 behaves differently in comparison to the original circuit 606. In the first case, the mutant is only active, and in the second case, the mutant is efficient or under successful activation, because it caused a different behavior.

It may be highlighted here, that U1 608 may be a duplicate of U1 shadow 606, also comprising the mutant. Since one aspect of the proposed method is output-driven, the output of XOR-gate 624 is useful in detecting whether the activation of a mutant really lets the module output behavior change. It should be clear from FIG. 6, that the output of the U1 shadow 606 is not connected to the real logic of the HDL design. In one embodiment, all of its outputs are only used for proper output activation detection.

Figure 7:
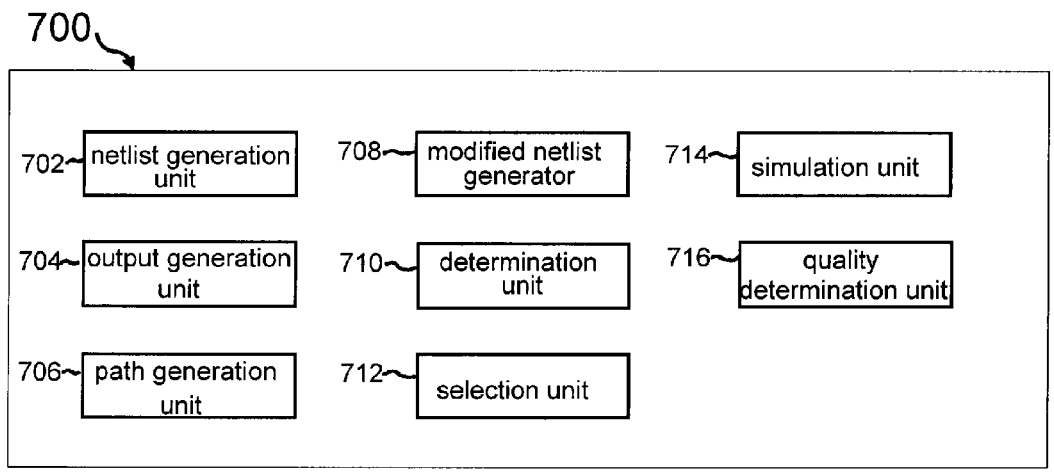
FIG. 7 shows one example of a block diagram of one embodiment of a verification system, in accordance with one or more aspects.

FIG. 7 shows a block diagram of one embodiment of the verification system 700. It may comprise a netlist generation unit 702 adapted for generating 102 a netlist from the hardware design language description 204, an output generation unit 704 adapted for generating 104 a list of hardware design outputs 506, and a path generation unit 706 adapted for generating 106 logical paths 312 in the netlist based on the list of hardware design outputs 506.

Furthermore, a modified netlist generator 708 adapted for generating 108 a modified netlist involving all logical paths may be present. The modified netlist generator 708 may comprise a determination unit 710 adapted for determining 110 for each gate 508, 510, 512, 514, 516 in each of the logical paths 312 whether the gate 508, 510, 512, 514, 516 is selected as an insertion point, and a selection unit 712 is adapted for selecting, 112, a fault type for the selected gate in the netlist and inserting a mutant 608 and associated activation and monitoring logic 614, 616, 624 in the netlist, depending on the fault type, wherein the fault type, the mutant 608 and the associated monitoring logic 614, 624 are each selected from a mutant database 322, whereby the modified netlist is generated.

Furthermore, the verification system 700 may comprise a simulation unit 714 adapted for performing 114 a fault simulation based on the modified netlist and collecting simulation result data using the monitoring logic 614, 624, and a quality determination unit 716 adapted for determining 116 the quality parameter for the verification environment from the fault simulation and the simulation result data.

Figure 8:
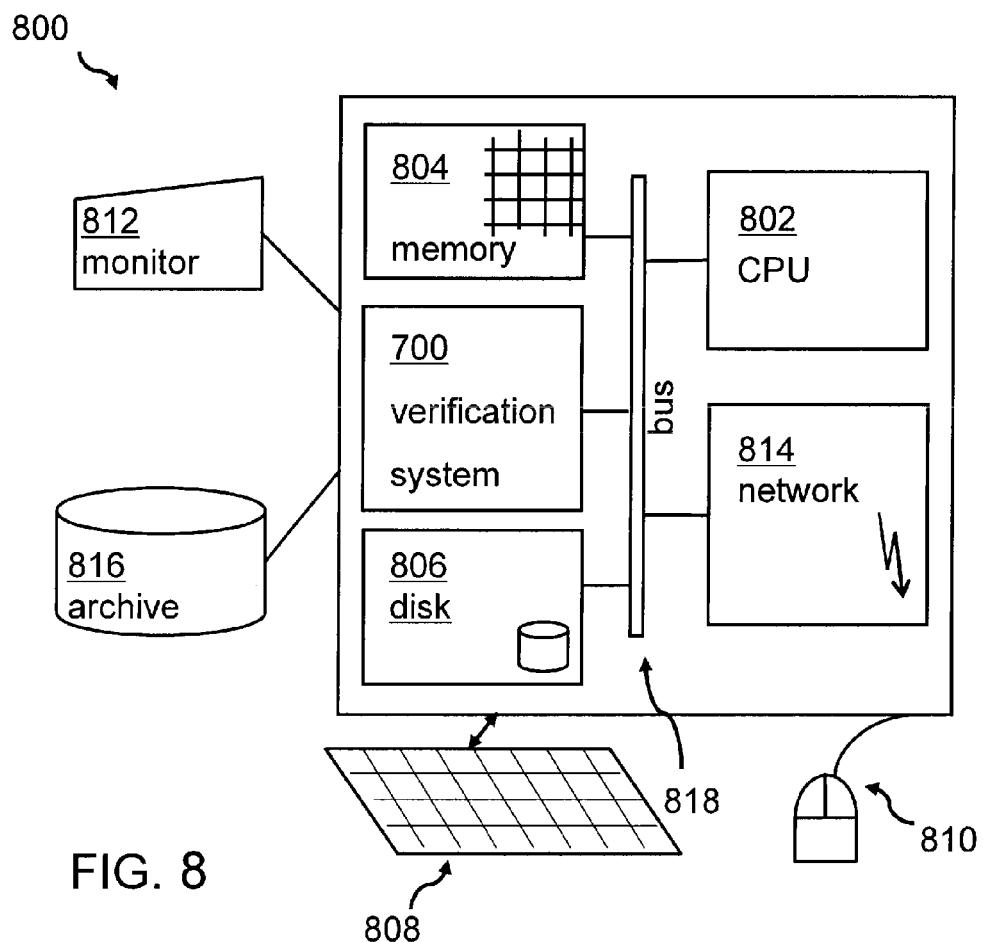
FIG. 8 shows one example of a block diagram of a computer system comprising the verification system.

Embodiments of the invention may be implemented together with virtually any type of computer, regardless of the platform being suitable for storing and/or executing program code. For example, as shown in FIG. 8, a computing system 800 may include one or more processor(s) 802 with one or more cores per processor, associated memory elements 804, an internal storage device 806 (e.g., a hard disk, an optical drive such as a compact disk drive or digital video disk (DVD) drive, a flash memory stick, a solid-state disk, etc.), and numerous other elements and functionalities, typical of today's computers (not shown). The memory elements 804 may include a main memory, e.g., a random access memory (RAM), employed during actual execution of the program code, and a cache memory, which may provide temporary storage of at least some program code and/or data in order to reduce the number of times, code and/or data must be retrieved from a long-term storage medium or external bulk storage 816 or archive for an execution. Elements inside the computer 800 may be linked together by means of a bus system 818 with corresponding adapters. Additionally, the verification system 700 may be attached to the bus system 818.

The computing system 800 may also include input means, such as a keyboard 808, a pointing device such as a mouse 810, or a microphone (not shown). Alternatively, the computing system may be equipped with a touch sensitive screen as main input device. Furthermore, the computer 800, may include output means, such as a monitor or screen 812 [e.g., a liquid crystal display (LCD), a plasma display, a light emitting diode display (LED), or cathode ray tube (CRT) monitor]. The computer system 800 may be connected to a network (e.g., a local area network (LAN), a wide area network (WAN), such as the Internet or any other similar type of network, including wireless networks via a network interface connection 814. This may allow a coupling to other computer systems or a storage network or a tape drive. Those, skilled in the art will appreciate that many different types of computer systems exist, and the aforementioned input and output means may take other forms. Generally speaking, the computer system 800 may include at least the minimal processing, input and/or output means, necessary to practice embodiments of the invention.

As described herein, one or more aspects address a method for determining a quality parameter for a verification environment for a register-transfer level hardware design language description of a hardware design, a verification system, a computing system, a data processing program, and a computer program product. The quality of verification environments for HDL designs, are assessed and improved. An improved checker quantity is provided.

According to one embodiment, a method for determining, i.e., evaluating or rating, a quality parameter for a verification environment may be provided. The verification environment may be adapted for a register-transfer level hardware design language description of a hardware design. The method may comprise generating a netlist from the hardware design language description, and generating a list of hardware design outputs. Additionally, the method may comprise generating logical paths in the netlist based on the list of hardware design outputs, and generating a modified netlist involving logical paths by determining for each gate in each of the logical paths whether the gate is selected as an insertion point, and selecting a fault type for the selected gate in the netlist, and inserting a mutant and associated activation, and monitoring logic in the netlist. The fault type, the mutant and the associated monitoring logic may be each selected from a mutant database. This way the modified netlist may be generated.

Furthermore, the method may comprise performing a fault simulation based on the modified netlist and collecting simulation result data using the monitoring logic, and determining the quality parameter for the verification environment from the fault simulation and the simulation result data.

According to another embodiment, a verification system for a register-transfer level hardware design language description of a hardware design may be provided.

The verification system may comprise a netlist generation unit adapted for generating a netlist from the hardware design language description, an output generation unit adapted for generating a list of hardware design outputs, and a path generation unit adapted for generating logical paths in the netlist based on the list of hardware design outputs.

Furthermore, the verification system may comprise a modified netlist generator adapted for generating a modified netlist involving all logical paths, the modified netlist generator comprising a determination unit adapted for determining for each gate in each of the logical paths whether the gate is selected as an insertion point, and a selection unit adapted for selecting a fault type for the selected gate in the netlist and inserting a mutant and associated activation and monitoring logic in the netlist, depending on the fault type, wherein the fault type, the mutant and the associated monitoring logic are each selected from a mutant database, whereby the modified netlist is generated.

Additionally, the verification system may comprise a simulation unit adapted for performing a fault simulation based on the modified netlist and collecting simulation result data using the monitoring logic, and a quality determination unit adapted for determining the quality parameter for the verification environment from the fault simulation and the simulation result data.

It may be noted that a plurality of mutants may be inserted into the netlist by selecting per gate, that the gate may be appropriate as an insertion point for a mutant. Thus, as described herein, many fault situations may happen in parallel because an activation of the mutants may happen dynamically and changeable during a fault simulation.

While the invention has been described with respect to a limited number of embodiments, those skilled in the art, having benefit of this disclosure, will appreciate that other embodiments may be devised, which do not depart from the scope of the invention, as disclosed herein. Accordingly, the scope of the invention should be limited only by the attached claims. Also, elements described in association with different embodiments may be combined. It should also be noted that reference signs in the claims should not be construed as limiting elements.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions, which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions, which execute on the computer or other programmable apparatus provide processes for implementing the functions/acts specified in the flowchart and/or block diagram block or blocks.

The block diagrams in the Figures illustrate the architecture, functionality, and operation of possible implementations of systems, methods and computer program products according to various embodiments of the present disclosure. In this regard, each block in the block diagrams may represent a module, segment, or portion of code, which comprises one or more executable instructions for implementing the specified logical function(s). It should also be noted that, in some alternative implementations, the functions discussed hereinabove may occur out of the disclosed order. For example, two functions taught in succession may, in fact, be executed substantially concurrently, or the functions may sometimes be executed in the reverse order, depending upon the functionality involved. It will also be noted that each block of the block diagrams, and combinations of blocks in the block diagrams, may be implemented by special purpose hardware-based systems that perform the specified functions or acts, or combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims, if any, are intended to include any structure, material, or act for performing the function in combination with other claimed elements, as specifically claimed. The description of aspects of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiment was chosen and described in order to best explain the principles of the invention and the practical application, and to enable others of ordinary skills in the art to understand the aspects of the invention for various embodiments with various modifications, as are suited to the particular use contemplated.

What is claimed is:

1. A method of determining a quality parameter for a verification environment for a hardware design language description of a hardware design, the method comprising:
generating a netlist from the hardware design language description;
generating a list of hardware design outputs;
generating logical paths in the netlist based on the list of hardware design outputs;
generating a modified netlist involving logical paths, wherein the generating the modified netlist comprises:
determining for each gate in each of the logical paths in the netlist whether the gate is selected as an insertion point; and
selecting a fault type for the selected gate in the netlist and inserting a mutant and associated activation and monitoring logic in the netlist, wherein the fault type, the mutant and monitoring logic of the associated activation and monitoring logic are each selected from a mutant database, wherein the modified netlist is generated;
performing a fault simulation based on the modified netlist and collecting simulation result data using the monitoring logic; and
determining the quality parameter for the verification environment from the fault simulation and the simulation result data, wherein the generating the netlist, the generating the list, the generating logical paths, the generating the modified netlist, the performing the fault simulation, and the determining the quality parameter are performed using at least one processing circuit.

2. The method according to claim 1, wherein the associated activation and monitoring logic comprises an XOR gate.

3. The method according to claim 2, wherein an effectiveness of a mutant is determined based on an output signal of the XOR gate having a mutant output signal and an output signal of an element of the netlist.

4. The method according to claim 1, wherein the associated activation and monitoring logic comprises a multiplexer using output signals of gates of the netlist and output signals of the mutants as input signals.

5. The method according to claim 4, wherein each mutant is dynamically activatable at runtime of the verification environment by controlling a select signal of the multiplexer.

6. The method according to claim 1, wherein the modified netlist comprises original logic paths, as well as the mutants.

7. The method according to claim 1, wherein the performing the fault simulation comprises activating the inserted mutant and monitoring the simulation result data.

8. The method according to claim 1, wherein input signals are fed in parallel to the elements of the netlist and to elements of the modified netlist.

9. The method according to claim 1, wherein the determining for each gate in each of the logical paths if the gate is selected as an insertion point comprises generating an efficiency vector for components of the logical path.

10. The method according to claim 9, wherein the efficiency vector comprises at least one out of the group comprising identifiers for an insertion point, a fault type and a mutant type.

11. A computer system for determining a quality parameter for a verification environment for a hardware design language description of a hardware design, the computer system comprising:
at least one processor; and
a memory storing instructions for execution by the at least one processor for implementing:
a netlist generation unit adapted to generate a netlist from the hardware design language description;
an output generation unit adapted to generate a list of hardware design outputs;
a path generation unit adapted to generate logical paths in the netlist based on the list of hardware design outputs;
a modified netlist generator adapted to generate a modified netlist involving logical paths, the modified netlist generator comprising:
a determination unit adapted to determine for each gate in each of the logical paths whether the gate is selected as an insertion point; and
a selection unit adapted to select a fault type for the selected gate in the netlist and inserting a mutant and associated activation and monitoring logic in the netlist, depending on the fault type, wherein the fault type, the mutant and monitoring logic of the associated activation and monitoring logic are each selected from a mutant database, wherein the modified netlist is generated;
a simulation unit adapted to perform fault simulation based on the modified netlist and collecting simulation result data using the monitoring logic; and
a quality determination unit adapted to determine the quality parameter for the verification environment from the fault simulation and the simulation result data.

12. The computer system according to claim 11, wherein the associated activation and monitoring logic comprises an XOR gate.

13. The computer system according to claim 12, wherein an effectiveness of a mutant is determined based on an output signal of the XOR gate having a mutant output signal and an output signal of an element of the netlist.

14. The computer system according to claim 11, wherein the associated activation and monitoring logic comprises a multiplexer using output signals of gates of the netlist and output signals of the mutants as input signals.

15. The computer system according to claim 11, wherein input signals are fed in parallel to the elements of the netlist and to elements of the modified netlist.

16. A computer program product for determining a quality parameter for a verification environment for a hardware design language description of a hardware design, the computer program product comprising
a computer readable storage medium readable by a processing circuit and storing instructions for execution by the processing circuit for performing a method comprising:
generating a netlist from the hardware design language description;
generating a list of hardware design outputs;
generating logical paths in the netlist based on the list of hardware design outputs;
generating a modified netlist involving logical paths, wherein the generating the modified netlist comprises:

determining for each gate in each of the logical paths whether the gate is selected as an insertion point; and selecting a fault type for the selected gate in the netlist and inserting a mutant and associated activation and monitoring logic in the netlist, wherein the fault type, the mutant and monitoring logic of the associated activation and monitoring logic are each selected from a mutant database, wherein the modified netlist is generated;

performing a fault simulation based on the modified netlist and collecting simulation result data using the monitoring logic; and determining the quality parameter for the verification environment from the fault simulation and the simulation result data.

17. The computer program product according to claim 16, wherein the associated activation and monitoring logic comprises an XOR gate.

18. The computer program product according to claim 17, wherein an effectiveness of a mutant is determined based on an output signal of the XOR gate having a mutant output signal and an output signal of an element of the netlist.

19. The computer program product according to claim 16, wherein the performing the fault simulation comprises activating the inserted mutant and monitoring the simulation result data.

20. The computer program product according to claim 16, wherein the determining for each gate in each of the logical paths if the gate is selected as an insertion point comprises generating an efficiency vector for components of the logical path.

\* \* \* \* \*